(12) United States Patent
Karniewicz

(10) Patent No.: US 7,096,446 B2
(45) Date of Patent: Aug. 22, 2006

(54) HIERARCHICAL SEMICONDUCTOR DESIGN

(75) Inventor: Joseph J. Karniewicz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 640 days.

(21) Appl. No.: 10/230,937

(22) Filed: Aug. 29, 2002

(65) Prior Publication Data

US 2003/0005400 A1    Jan. 2, 2003

Related U.S. Application Data

(63) Continuation of application No. 09/031,398, filed on Feb. 26, 1998, now Pat. No. 6,449,757.

(51) Int. Cl.
    *G06F 17/25* (2006.01)
(52) U.S. Cl. .............. 716/9; 716/1; 716/4; 716/17
(58) Field of Classification Search ............ 716/1, 716/9, 12, 4, 17; 438/125
    See application file for complete search history.

(56) References Cited

U.S. PATENT DOCUMENTS

| | | | | |
|---|---|---|---|---|
| 5,455,938 A | 10/1995 | Ahmed | ...... | 364/488 |
| 5,519,627 A | 5/1996 | Mahmood et al. | ...... | 364/488 |
| 5,524,244 A | 6/1996 | Robinson et al. | ...... | 395/700 |
| 5,675,545 A | 10/1997 | Madhavan et al. | ...... | 365/201 |
| 5,726,902 A | 3/1998 | Mahmood et al. | ...... | 364/489 |
| 5,731,223 A * | 3/1998 | Padmanabhan | ...... | 438/125 |
| 5,754,760 A | 5/1998 | Warfield | ...... | 395/183.14 |
| 5,761,498 A | 6/1998 | Ooe et al. | ...... | 395/610 |
| 5,774,358 A | 6/1998 | Shrote | ...... | 364/191 |
| 5,890,155 A | 3/1999 | Steinman et al. | ...... | 707/9 |
| 5,893,910 A | 4/1999 | Martineau et al. | ...... | 707/10 |
| 5,911,139 A | 6/1999 | Jain et al. | ...... | 707/3 |
| 5,983,277 A | 11/1999 | Heile et al. | ...... | 709/232 |
| 6,009,251 A | 12/1999 | Ho et al. | ...... | 716/5 |
| 6,011,911 A | 1/2000 | Ho et al. | ...... | 716/5 |
| 6,026,223 A | 2/2000 | Scepanovic et al. | ...... | 395/500.11 |
| 6,026,226 A | 2/2000 | Heile et al. | ...... | 395/500.13 |
| 6,035,297 A | 3/2000 | Van Huben et al. | ...... | 707/8 |
| 6,175,949 B1 | 1/2001 | Gristede et al. | ...... | 716/11 |
| 6,249,902 B1 | 6/2001 | Igusa et al. | ...... | 716/10 |
| 6,421,814 B1 | 7/2002 | Ho | ...... | 716/5 |
| 6,425,113 B1 | 7/2002 | Anderson et al. | ...... | 716/5 |
| 6,449,757 B1 | 9/2002 | Karniewicz | ...... | 716/7 |

* cited by examiner

*Primary Examiner*—Thuan Do
(74) *Attorney, Agent, or Firm*—Schwegman, Lundberg, Woessner & Kluth, P.A.

(57) ABSTRACT

Hierarchical semiconductor structure design is disclosed. One aspect of the invention is a computerized system that includes a semiconductor structure (such as a semiconductor test structure) and a basic atom. The system also includes a hierarchy of abstractions ordered from highest to lowest. Each abstraction relates a plurality of instances of an immediately lower abstraction; the highest abstraction corresponds to the structure, and the lowest abstraction corresponds to the basic atom. A plurality of sets of parameters also is included within the system, where each set of parameters corresponds to an instance of an abstraction. Changing one of the set of parameters for an instance changes at least one of the set of parameters for an instance of an immediately lower abstraction.

15 Claims, 13 Drawing Sheets

| | |
|---|---|
| C1A | BASIC ATOM CELL DERIVED FROM C1 CELL, BUT HAVING NO CAPS, SYMMETRIC CONTS AND SURROUNDS, AND FULL CONTROL OF PAD AND CONT ALIGN |
| C1_1 | A VARIANT OF C1 WITH TWO IMPLANT SHOW LAYERS, BUT NO X OR Y SHADOW CONTROL |
| C1_2 | A VARIANT OF C1 WITH THREE IMPLANT SHADOW LAYERS, BUT NO X OR Y SHADOW CONTROL |
| C1B | WITHIN THIS BASIC ATOM CELL, THE METAL IS ALIGNED OVER THE LAYER AND THE CONTACTS ARE ALIGNED WITHIN THE METAL. CONTACTS ALIGN WITHIN THE INTERSECTION OF THE METAL AND BASE LAYERS. |
| C1B_1 | A VARIATION OF C1B WITH THREE IMPLANT LAYERS |
| L1 | A BASIC ATOM CELL HAVING 1X,1Y AND LAYER ONLY |
| L1A | A BASIC ATOM CELL HAVING 1X, 1Y AND LAYER, AND TWO SHADOW LAYERS FOR IMPLANT MASKS, BUT NO X OR Y SHADOW CONTROL |
| L1B | SIMILAR TO L1A BY WITH X AND Y CONTROL OVER IMPLANT LAYER SURROUNDS |
| L1C | LIKE L1A BUT WITH THREE SHADOW IMPLANT LAYERS |
| L1D | A "REPEAT IN Y" VERSION OF L1C, USEFUL FOR "FINGER" TYPE STRUCTURES WITH IMPLANTS |
| L1E | A BASE LAYER WITH TWO OTHER TAG LAYERS ATTACHED TO IT-TAG LAYERS SHIFT BUT CANNOT SHADOW |
| L1F | A DERIVATIVE OF L1E WITH ONLY ONE TAG LAYER |
| L1G | A BASE LAYER HAVING FOUR OTHER TAG LAYERS; AN EXTENSION OF L1D |
| M1 | AN MBIT SHAPED ACTIVE AREA ATOM WITH FORTY-FIVE DEGREE ANGLES BUILT IN |
| J1 | A JOG LINE WITH A VARIABLE ANGLE |
| S1 | A JOG LINE STRUCTURE BUILT UP WITH ON-GRID STAGGERS ON AN ANGLED LINE |
| T1 | A TRIANGLE SHAPED TOM |
| T1D | A DOWN TRIANGLE VERSION OF T1 |
| T1U | AN UP TRIANGLE VERSION OF T1 |

Fig.6

| 1002 | 1004 | | | |
|------|------|------|------|------|
| L2   | L1   | L1   | L1   |      |
| L3_1 | L1   | L13  | L1   |      |
| C2   | C1   | C1   |      |      |
| C2A  | C1A  | L1   |      |      |
| C2B  | C1   | C1B  |      |      |
| C2C  | C1_2 | C1B  |      |      |
| C2D  | C1_2 | C1_2 |      |      |
| C2E  | L1C  | L1   |      |      |
| C2F  | L1C  | L1C  |      |      |
| C3_1 | C1   | C1   | C1   |      |
| C3A_1 | C1A | L1   | C1A  |      |
| C3B_1 | C1B | C1B  | C1B  |      |
| C3D_1 | C1B | C1B  | C1B  |      |
| C3E_1 | L1  | C1B  | C3E_1 |     |
| C3F_1 | L1  | L1   | L1   |      |
| C3G_1 | L1A | L1A  | L1A  |      |
| C3H_1 | L1C | L1C  | L1C  |      |
| C3_2 | C1   | C1   | C1   |      |
| C3A_2 | C1A | L1   | L1   |      |
| C3B_2 | C1A | L1   | C1A  |      |
| C3C_2 | L1  | C1B  | L1   |      |
| C3C_2A | L1 | C1B  | L1   |      |
| C3_2E | L1D | C1B  | L1D  |      |
| C3_2F | L1D | C1B_1 | L1D |      |
| C4_11 | L1  | L1   | C1A  | C1   |
| C4A_11 | C1A | C1A | L1   | L1   |
| C4_21 | L1  | L1   | C1B  | L1   |
| C4_22 | L1  | C1B  | L1   | C1B  |
| C4_22A | L1 | C1B  | L1   | C1B  |
| C4_23 | C1  | L1   | L1   | L1   |
| C4_23A | C1B | L1  | L1   | L1   |
| C4_23B | L1E | L1E  | L1E  | L1E  |
| C5_134 | C1  | C1   | C1   | C1   | C1   |
| C5_134B | C1 | L1   | L1   | C1   | L1   |
| C5_134C | C1B | L1  | C1B  | C1B  | L1   |
| C5_111 | L1  | L1   | L1   | L1   | L1   |
| C5_111A | L1A | L1A | L1A  | L1A  | L1A  |
| C5_222 | C1B | L1   | C1   | C1B  | C1B  |
| C5A_222 | L1 | L1   | C1   | L1   | L1   |
| C5_234 | L1  | C1B  | L1   | C1B  | L1   |
| C5_234A | L1 | L1   | L1   | L1   | L1   |
| C5_234B | C1 | L1   | L1   | C1   | L1   |
| C5_234C | L1 | C1B  | L1   | C1B  | L1   |
| C5_234D | L1 | C1B_1 | L1  | C1B  | L1   |
| C5_234E | L1A | C1B_1 | L1 | C1B  | L1   |

Fig.10A

| | | | | | | | | |
|---|---|---|---|---|---|---|---|---|
| C6_1135 | C1A | L1 | C1A | C1A | C1A | L1 | | |
| C6_1111 | L1 | L1 | C1 | L1 | L1 | L1 | | |
| C6_2244 | C1B | L1 | C1B | L1 | L1 | L1 | | |
| | | | | | | | | |
| C7_22245 | C1 | C1 | C1 | C1 | C1 | C1 | C1 | |
| C7A_22245 | C1A | L1 | C1A | L1 | L1 | C1A | C1A | |
| C7_21156 | C1B | C1 | C1B | C1B | L1 | L1 | L1 | |
| C7_11141 | C1B | C1B | C1B | L1 | L1 | L1 | L1 | |
| C7_23456 | L1 | L1 | L1 | L1 | L1 | L1 | L1 | |
| C7_11444 | C1B_1 | C1B | L1C | C1B_1 | L1C | C1B | C1B_1 | |
| | | | | | | | | |
| C8_113457 | C1A | L1 | L1 | L1 | C1A | C1A | C1A | L1 |
| C8A_113457 | C1B | L1 | C1B | C1B | L1 | L1 | C1B | L1 |
| | | | | | | | | |
| C9_1112345 | L1 | L1 | L1 | L1 | L1 | C1A | C1A | C1A | C1A |
| C9_2111277 | C1B | L1 | C1B | C1B | C1B | L1 | L1 | L1 | L1 |
| | | | | | | | | |
| C10_21112771 | | | | | | | | |
| | | | | | | | | |
| C10_11111111 | | C1_2 | L1C | L1C | L1G | L1F | L1 | L1E |

| | |
|---|---|
| C3C_2A | SAME AS C3C_2 BUT SHIFTS SO THAT BOTTOM CENTER OF L1 IS FIXED AT ORIGIN |
| C4_22A | SAME AS C4_22 BUT SHIFTS SO THAT BOTTOM CENTER OF L1 IS FIXED AT ORIGIN |
| C5_234C | SAME AS C5_234 BUT SHIFTS SO THAT BOTTOM CENTER OF L1 IS FIXED AT ORIGIN |
| C5_234D | SHIFTS SO THAT BOTTOM CENTER OF L1 IS FIXED AT ORIGIN/ADDS IMPLANT LAYERS |
| C5_234E | SHIFTS SO THAT BOTTOM CENTER OF L1 IS FIXED AT ORIGIN/ADDS IMPLANT LAYERS |

| | |
|---|---|
| C3C_2A | USED IN PAD_01 |
| C4_22A | USED IN PAD_02 – RARELY USED |
| C5_234C | USED IN PAD_03 |
| C5_234D | USED IN PAD_03_A – GOOD FOR NWELLS TOO! |
| C5_234E | USED IN PAD_03_B – ALLOWS NWELLS AND TWO IMPLANT LAYERS ON PAD BASE |

Fig.10B

| | |
|---|---|
| BIPOLAR_01 | BIPOLAR RECTANGLE XOR WITH CENTER/RING DIFF1 AND RING DIFF2 |
| CONTCHAIN_01 | CONTACT CHAIN WITH SLOTS ON CONTACTS |
| CORNERCAP_01 | A CAPACITOR STRUCTURE SIMILIAR TO CORNERDIODE_01 BUT WITH GATE |
| CORNERDIODE_01 | DIODE STRUCTURE WHICH MIXIMIZES NUMBER OF CORNERS |
| CORNERDIODE_01_A | LIKE CORNERDIODE_01 BUT USES PAD_03_B WITH 2 IMPLANT LAYERS |
| DIODE_01 | AREA DIODE WITH OPTION FOR 3 IMPLANT LAYERS |
| DIODE_01_A | LIKE DIODE_01 BUT WITH PAD_03_A AND PAD SHIFT OPTIONS |
| DIODE_01_B | LIKE DIODE_01_A BUT WITH PAD_03_B AND 2 IMPLANT LAYERS |
| DIODE_02 | SPIDER TYPE INTERDIG FINGER DIODE STRUCTURE-3 IMP LAYERS/PAD |
| DIODE_02_A | LIKE DIODE_02 BUT WITH PAD_03_A AND PAD SHIFT OPTIONS |
| DIODE_02_B | LIKE DIODE_02_A BUT WITH PAD_03_B |
| DIODE_03 | LIKE DIODE_01 BUT WITH CONTACT OPTIONS ON ACTIVE AREA |
| DRC_01 | DRC CHECK STRUCTURE-STEPS LAYER ABOVE BASE IN FIXED INCS |
| DRC_01_25 | LINKS 5 DRC_01 STRUCTURES TOGETHER |
| FTRAN_01 | FIELD TRANSISTOR WITH OPTS FOR INTER/INTRA WELL M1/M2/POLYGATE |
| FTRAN_02 | FIELD TRANSISTOR WITH 2 DEVICES AND IMPLANT OPTIONS |
| GATECAP_01 | RECTANGULAR ACTIVE WITH POLY GATE/OPTIONS FOR NWELL/TIEDOWN |
| GATECAP_02 | RECTANGULAR ACTIVE WITH GATE/OPTION FOR 3 IMP LAYERS/PAD |
| GATECAP_03 | FINGER BASE LAYER WITH GATE/OPTION FOR 3 IMP LAYERS/PAD |
| GATECAP_04 | COPY OF GATECAP_02 BUT WITH PAD ON ACTIVE AREA AS WELL AS GATE |
| HSGATESHORTS_01 | MAC STRUCTURE WITH HORSESHOE GATES ON 4 SIDES-2 PADS |
| INTERDIG_01 | INTERDIGITATED FINGER STRUCTURE-ONE HALF |
| INTERDIG_01_RIGHT | INTERDIGITATED FINGER STRUCTURE-ONE HALF-RIGHT SIDE ONLY-NOPAD |
| INTERDIG_01_LEFT | INTERDIGITATED FINGER STRUCTURE-ONE HALF-LEFT SIDE ONLY-NOPAD |
| INTERDIG_02 | FULLY INTERDIGITATED FINGER STRUCTURE |
| INTERDIG_03 | FULLY INTERDIGITATED FINGER STRUCTURE WITH INTERWINING SNAKE |
| INTERDIG_04 | SPIDER TYPE INTERDIGITATED FINGER STRUCTURE- IMPLS ON SPINE-XXX |
| KELVIN_01 | FOUR TERMINAL KELVIN CONTACT MONITOR WITH IMPLANT LAYER |
| LATCHUP_01 | BASIC LATCHUP WITH WELL/SUB TIES/GUARD BARS/ACTIVE/NWELL |
| LINEWIDTH_01 | RESISTOR STRUCTURE USEFUL FOR OPC CHARACTERIZATION/SHORTS OPTS |
| LINKS_01 | STRUCTURE TO FORM METAL LINKS ON CONTACT CHAIN ARRAYS |
| LINKS_02 | A STRUCTURE TO HORIZONTALLY LINK UP FIVE(MAX) BLOCKS CENTER TO CENTER |
| LINKS_03 | A STRUCTURE TO VERTICALLY LINK UP EIGHT(MAX) BLOCKS TO A CENTER BASE LINE |
| MAC_01 | TWO SIDED MISALIGN CONTACT STRUCTURE/WITH IMPLANT OPTIONS/PAD |
| MAC_02 | THREE SIDED MISALIGN CONTACT/WITH IMPLANT/PAD OPTIONS |
| MAC_03 | AN ARRAY OF MAC_01 STRUCTURES |

Fig.11A

| | |
|---|---|
| OPC_01 | FEATURESIZE/LINESIZE ARRAY FOR OPC CHARACTERIZATION |
| PAD_01 | METAL BOND PAD |
| PAD_02 | METAL/BASE LAYER BOND PAD WITH BASE AND TAP OPTIONS |
| PAD_03 | COMPLEX PAD WITH M1/M2-TAB-BASE/CONT/TAB OPTIONS |
| PAD_03_A | DERIVED FROM PAD_03. ALLOWS FOR NWELL OPTIONS |
| PAD_03_B | DERIVED FROM PAD_03_A. ALLOWS FOR 2 IMPLANT LAYERS ON PADS |
| PROXTRAN_01 | PROXIMITY TRANSISTOR-VARIABLE GATE NUM/GATE TEST-SVT |
| RES4_01 | FOUR TERMINAL RESISTOR STRUCTURE-INLINE PADS-CELLH/W |
| RES4_02 | LIKE RES4_01 BUT WITH 2 IMPLANT SHADOW LAYERS THROUGH L1A |
| RES2_01 | TWO TERMINAL RESISTOR STRUCTURE |
| SNAKERES_01 | SNAKE SHAPED RESISTOR STRUCTURE-ALSO USED IN INTERDIG_03 |
| TRAN_01 | I-TYPE TRANSISTOR WITH WELL/TIEDOWN/LIF OPTIONS |
| TRAN_02 | NON I-TYPE TRANSISTOR WITH WELL/TIEDOWN/LIF/CONTTOGATESP OPTS |
| TRAN_03 | A VERY SIMPLE I TYPE TRANSISTOR-NO WELLS, TIES, DIODES |
| TRANSTRING_01 | LINKS 4 TRAN_03 CELLS OPTIONS FOR PADS/GATEPAD |
| VDP_01 | FOUR TERMINAL VDP RESISTOR-CORESIZE/CELLSIZE |
| VDP_02 | FOUR TERMINAL VDP RESISTOR WITH IMPLAYER OPTIONS-CORESIZE/CELLSIZE |

Fig.11B

HIERARCHICAL SEMICONDUCTOR DESIGN

RELATED APPLICATIONS

This application is a Continuation of Ser. No. 09/031,398 filed on Feb. 26, 1998 now U.S. Pat. No. 6,449,757, which is incorporated herein by reference.

FIELD OF THE INVENTION

This invention relates generally to the design of semiconductors, and more particularly to such design that is hierarchical in nature.

BACKGROUND OF THE INVENTION

Semiconductor technology pervades most electronic devices today. Computers, televisions, videocassette recorders, cameras, etc., all use semiconductor integrated circuits to varying degrees. For example, the typical computer includes microprocessors and dedicated controller integrated circuits (i.e., video controllers, audio controllers, etc.), as well as memory, such as dynamic random-access memory. The design of semiconductors, therefore, is a crucial consideration of the design of almost any electronic device.

One type of semiconductor design is the design of semiconductor test structures. A semiconductor integrated circuit, for example, must be able to operate in a variety of different conditions (varying temperatures, for example), and perform within a variety of different specifications (i.e., speed, power consumption, etc.). Semiconductor test structures are therefore utilized to ensure that various components of a given semiconductor will perform according to specification in different conditions. Test structures are not integrated circuits sold to end consumers as part of an electronic device, but rather are used internally to ascertain that the end products will perform correctly.

To aid in the design of semiconductors in general, and the design of semiconductor test structures in particular, software such as Design Framework II (DF2), available from Cadence Design Systems, Inc., has been developed. DF2, for example, includes an editor that permits a designer to place various components over a semiconductor substrate as necessary. DF2 also provides for a degree of flexibility in the design of such components. Specifically, DF2 includes parameterized cells, or pcells, that allow the designer to create customized instances of a pcell every time the pcell is placed on a layer. For example, a transistor can be created and have parameters assigned thereto to provide for control of its width, length, and number of gates. When instances of the transistor are placed on the layer, different values may be assigned to each of these parameters. According to the parameter values, each instance varies in size and composition.

The pcell approach of DF2, however, is a top-down semiconductor design approach, and thus has limitations and disadvantages associated with it. A designer may, for example, first draw a transistor, and then program that transistor to respond to parameters that will cause various parts of the design to take on those parameter values. This can be a very complex, tedious and error-prone process. For example, if the designer desires contacts to fill in the available active area space while maintaining a certain pitch and minimum separation from the active area edge, the equations to accomplish this for an arbitrarily sized active area are complex within DF2. Furthermore, these equations are specific to the transistor under development. If the designer desires to design another parameterized object—for example, a field transistor or a contact chain—he or she needs to repeat the entire process.

Therefore, there is a need for an approach to the designing of semiconductors that avoids the pitfalls of top-down design. The approach should enable a semiconductor designer to avoid having to "start from scratch" when designing a new parameterized object. Thus, the approach should be more flexible and easier to use than prior art design approaches.

SUMMARY OF THE INVENTION

The above-mentioned shortcomings, disadvantages and problems are addressed by the present invention, which will be understood by reading and studying the following specification. One aspect of the invention is a computerized system that includes a semiconductor structure and a basic atom. The system also includes a hierarchy of abstractions ordered from highest to lowest. Each abstraction relates a plurality of instances of an immediately lower abstraction; the highest abstraction corresponds to the structure, and the lowest abstraction corresponds to the basic atom. A plurality of sets of parameters also is included within the system, where each set of parameters corresponds to an instance of an abstraction. Changing one of the set of parameters for an instance of an abstraction changes at least one of the set of parameters for an instance of an immediately lower abstraction. Parameters desirably relate to attributes of an abstraction.

For example, in one embodiment, the hierarchy may have six abstractions: atoms, higher-order cells, devices, structures, and also circuits and integrated circuit chips, ordered from lowest to highest. Each of these abstractions has an associated set of parameters. Instances of atoms are used to create higher-order cells, instances of higher-order cells are used to create devices, and instances of devices are used to create structures. Each instance of an abstraction relates together a plurality of instances of an immediately lower-level abstraction. Thus, changing parameters associated with an instance of a higher-order cell, for example, automatically changes the parameters of the instances of atoms related by that higher-order cell.

In this manner, once appropriate atoms and higher-order cells have been designed, devices and structures can be designed easily by relating together instances of the atoms and higher-order cells. Most importantly, if the specifications governing a given structure need to be changed, a user merely has to change the parameters for the structure, which then affects the parameters of the instances of the lower level devices, higher-order cells, and atoms. That is, redesign of the structure at the atom, or even at the higher-order cell, level is not necessary. This means that semiconductor design becomes more intuitive, and enables modification of existing structures to create new structures, in a non-tedious and non-time-consuming manner.

The present invention includes computerized systems, methods, hierarchical data structures, semiconductor structures, computer-readable media, basic atom cells, and computers of varying scope. In one embodiment of the invention, the invention is implemented in conjunction with Design Framework II (DF2) software available from Cadence Design Systems, Inc. In addition to the aspects and advantages of the present invention described in this summary, further aspects and advantages of the invention will

BRIEF DESCRIPTION OF THE DRAWINGS

FIG. 6 shows a table of basic atom cells, according to one embodiment of the invention;

FIG. 10 shows a table of higher-order cells, according to one embodiment of the invention; and, FIG. 11 shows a table of devices and structures, according to one embodiment of the invention.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Those of ordinary skill within the art will appreciate that the detailed description is presented in accordance with the example of designing a semiconductor test structure. However, the invention itself is not limited to the design of semiconductor test structures. Rather, the invention may be utilized in the design of any semiconductor structure, in a manner identical to that described with respect to semiconductor test structures. The example of the semiconductor test structure is only presented in the detailed description specifically as an exemplary structure, to provide for clear description of the invention.

The detailed description is divided into three sections. In the first section, an exemplary embodiment of the invention is described. In the second section, a specific embodiment of the invention that may be practiced in conjunction with Design Framework II (DF2) software available from Cadence Design Systems, Inc., is presented. Finally, in the third section, a conclusion of the detailed description is provided.

EXEMPLARY EMBODIMENT OF THE INVENTION

Figure 1A:
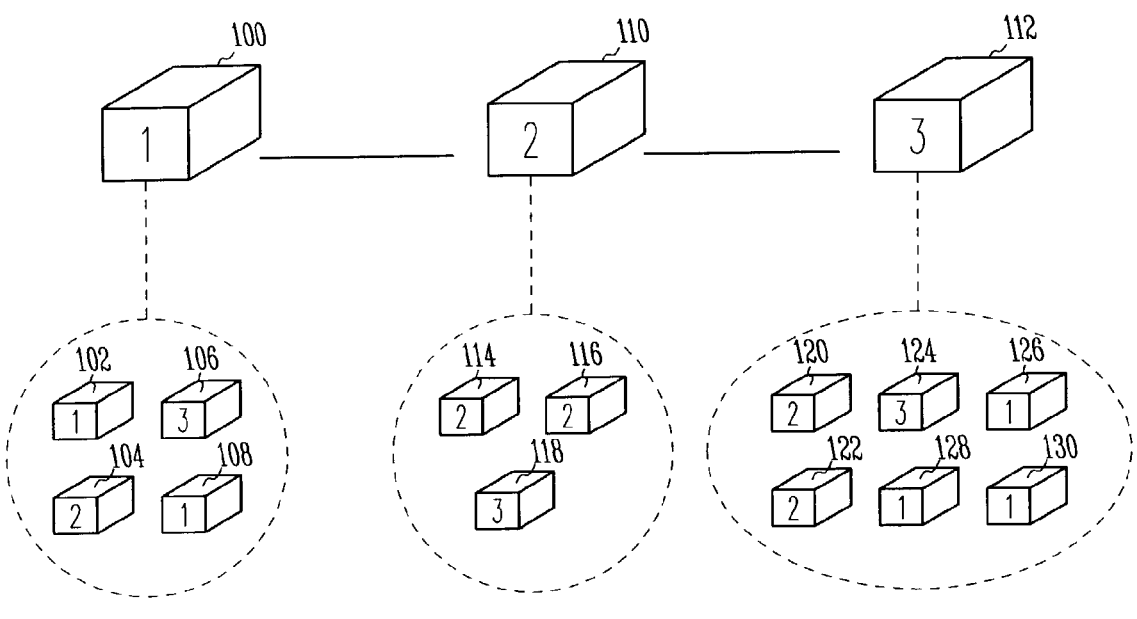
FIGS. 1(a), 1(b), and 1(c) show diagrams of a representative hierarchy of a semiconductor test structure, according to an exemplary embodiment of the invention.
Figure 1B:
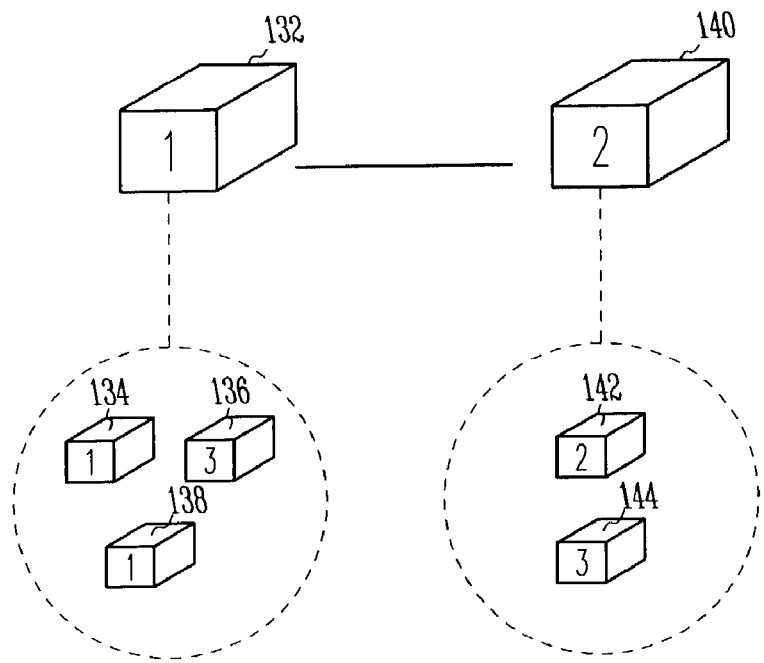
Figure 1C:
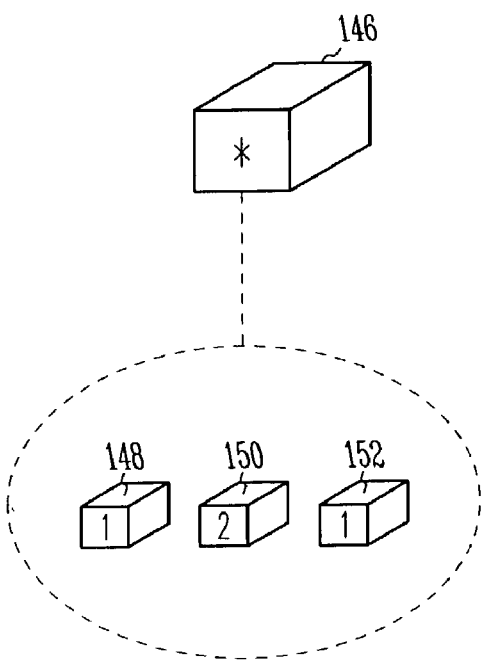
Figure 2:
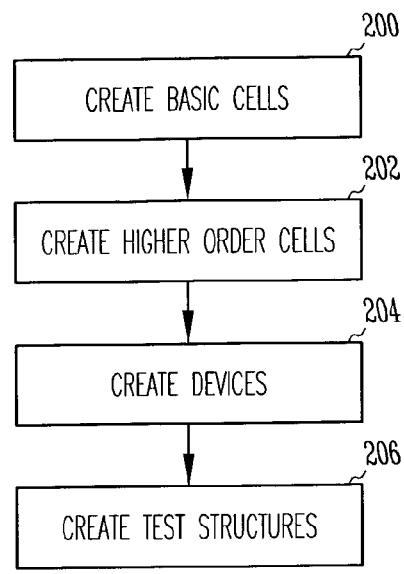
FIG. 2 shows a flowchart of a method according to an exemplary embodiment of the invention.
Figure 3:
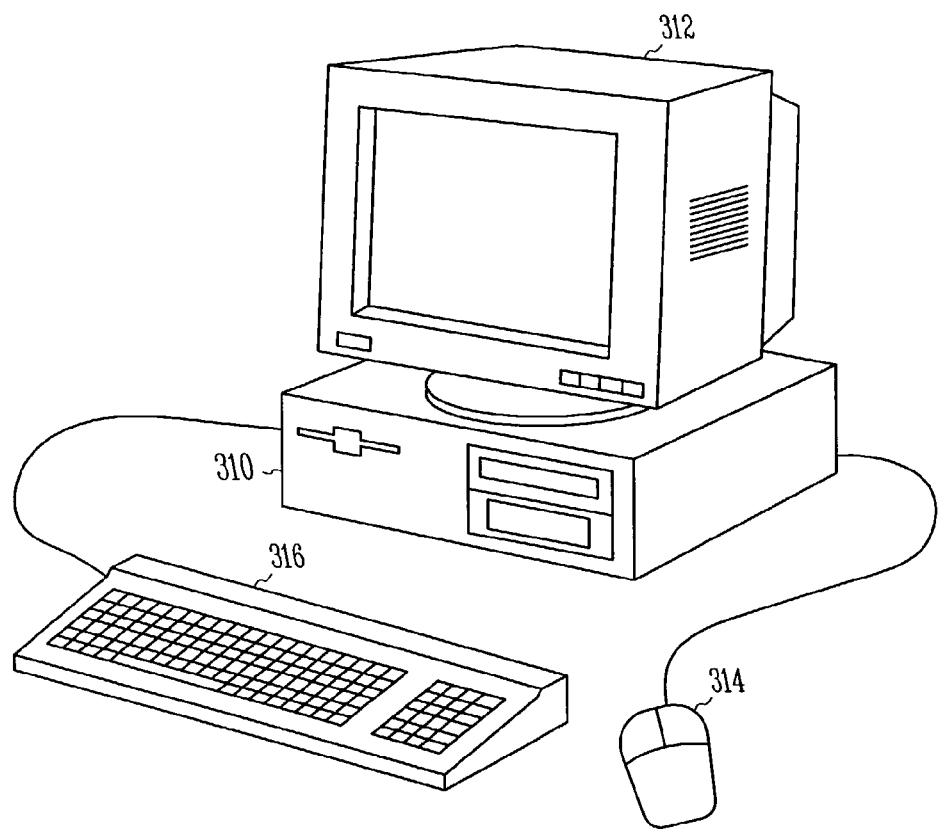
FIG. 3 shows a diagram of a computer in conjunction with which an exemplary embodiment of the invention may be implemented.
Figure 4:
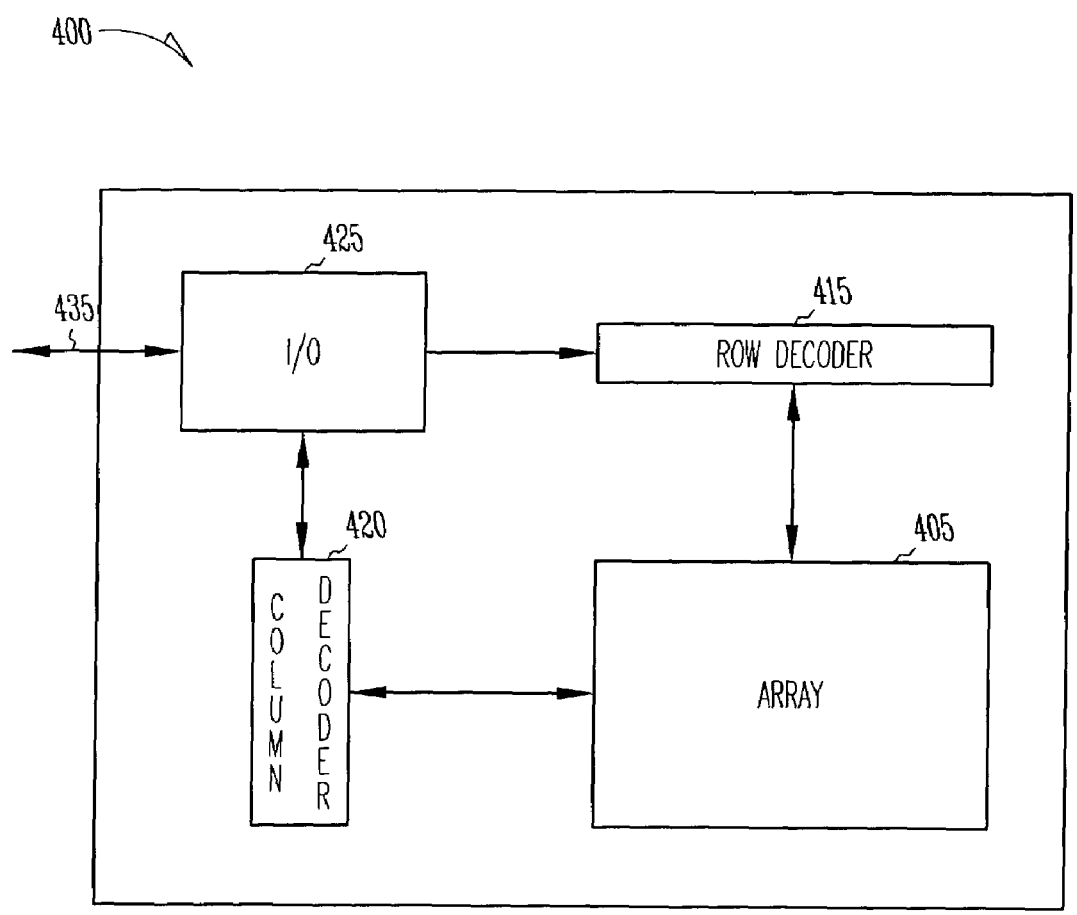
FIG. 4 shows a diagram of a semiconductor memory in conjunction with which a semiconductor test structure hierarchically designed in accordance with an embodiment of the invention may be tested.

A description of an exemplary embodiment of the invention is provided in this section of the detailed description. The description is provided in conjunction with reference to FIGS. 1(a), 1(b), 1(c), 2, 3 and 4. FIGS. 1(a)–1(c) show diagrams of a representative hierarchy of a semiconductor test structure, according to an exemplary embodiment. FIG. 2 shows a flowchart of a method according to an exemplary embodiment, while FIG. 3 shows a diagram of a computer in conjunction with which an exemplary embodiment of the invention may be implemented. Finally, FIG. 4 shows a diagram of a semiconductor memory in conjunction with which a semiconductor test structure hierarchically designed in accordance with an embodiment of the invention may be tested.

Referring first to FIG. 1(a), a diagram of three higher-order cells, each defined by relating a number of instances of basic atom cells, is shown. Higher-order cell 100, defining type "1" higher-order cells, is defined by relating four instances of basic atom cells, atoms 102, 104, 106 and 108. Atoms 102 and 108 are instances of basic atom cells of type "1"; atom 104 is an instance of basic atom cell of type "2"; and, atom 106 is an instance of basic atom cell of type "3". The type defined by higher order cell 100 (i.e., "1"), and the types of atoms 102, 104, 106 and 108 (i.e., "1", "2", and "3"), are for representative purposes only, and do not specifically relate to any given type of semiconductor component. Thus, the types as used in FIG. 1(a) (and as will be used in FIG. 1(b) and FIG. 1(c) as well) are for notational and descriptive purposes only.

Furthermore, each of higher order cell 100, and atoms 102, 104, 106 and 108 have a set of parameters related to its type. For example, the parameters may be related to placement, size, etc. (i.e., different attributes of the given cell). Desirably, higher order cell 100 has parameters that when changed also change the parameters of atoms 102, 104, 106 and 108 as necessary. Thus, higher order cell 100 relates atoms 102, 104, 106 and 108 to one another. Changing a parameter in cell 100 that causes that cell to become larger, for example, causes corresponding changes in atoms 102, 104, 106 and 108 that make up that instance of cell 100.

Still referring to FIG. 1(a), two other higher-order cells are defined, cells 110 and 112. Cell 110 is made up of atoms 114, 116 and 118. Atoms 114 and 116 are of type "2", and atom 118 is of type "3"; cell 110 itself defines type "2" for higher-order cells. Similarly, cell 112 is made up of atoms 120, 122, 124, 126 and 128, where atoms 120 and 122 are of type "2", atom 124 is of type "3", and atoms 126, 128 and 130 are of type "3". Cell 112 itself defines type "3" for high-order cells. As with cell 100 and its constituent atoms, cells 110 and 112 and their constituent atoms each has a set of parameters related to its type. Desirably, when a parameter of either cell 110 or 112 changes, one or more parameters of one or more of the associated constituent atoms also change.

The basic hierarchical structure shown in FIG. 1(a) is a powerful tool for the design of semiconductor test structures. For example, once higher-order cells 100, 110 and 112 have been defined as is shown in FIG. 1(a), they may be utilized to create more complex devices and structures, without forcing the designer to concern him or herself over details regarding the individual constituent atoms of the higher-order cells. For example, the designer may wish to design a transistor. Atoms 102 and 104 may be the two basic atoms necessary in such a design; each exists independently and has significant programming therein. Cell 100, then, may be a higher-level structure, where parameters from atoms 102 and 104 are inherited up to cell 100. A cell called tran, for transistor, is then created by placing an instance of cell 100 and setting the parameters of cell 100 such that a transistor is formed—the cell tran can then be used by anyone by setting its parameters. Transistors of different sizes and shapes can be created.

An additional level of the hierarchical structure initially described in FIG. 1(*a*) is shown in FIG. 1(*b*), which is a diagram of two devices, each defined by relating a number of instances of the higher-order cells that have been defined in FIG. 1(*a*). Device 132, defining type "1" devices, is defined by relating three instances of higher-order cells, cells 134, 136 and 138. Cells 134 and 138 are instances of cells of type "1," as has been defined as cell 100 of FIG. 1(*a*); cell 136 is an instance of cells of type "3," as has been defined as cell 112 of FIG. 1(*a*). As with FIG. 1(*a*), the type defined by device 132 is for representative purposes only, and does not specifically relate to any given type of semiconductor component.

Each of device 132 and cells 134, 136 and 138 has a set of parameters related to its type. Desirably, device 132 has parameters that when changed also change the parameters of cells 134, 136 and 138, which in turn change the parameters of the atoms making up these cells (not shown in FIG. 1(*b*)). That is, changing a parameter for device 132 may change a parameter for cell 136, which as a type "3" higher-order cell has six constituent atoms, as has been shown in and described in conjunction with FIG. 1(*a*). Thus, the changing of the parameter for cell 136 instigated by changing a parameter for device 132 also may change one or more parameters of one or more of these six constituent atoms.

Still referring to FIG. 1(*b*), one other device is defined, device 140. Device 140 is made up of two instances of higher-order cells, cells 142 and 144. Cell 142 is of type "2," as has been defined as cell 110 of FIG. 1(*a*), and cell 144 is of type "3," as has been defined as cell 112 of FIG. 1(*a*). Device 140 itself defines type "2" for devices. As with device 132 and its constituent higher-order cells, device 140 and its constituent higher-order cells each has a set of parameters related to its type. Desirably, when a parameter of device 140 changes, one or more parameters of one or more of its constituent cells changes as well, propagating a change of one or more parameters of one or more of the atoms making up these constituent cells.

Therefore, the basic hierarchical structure shown in FIG. 1(*a*) is expanded by the structure shown in FIG. 1(*b*). In FIG. 1(*b*), two devices are defined. A designer of a semiconductor test structure may therefore utilize these devices within the test structure, such that the designer does not need to concern him or herself with the actual cells making up these devices, or the constituent atoms making up the higher-cells. The devices may thus be viewed as a higher abstraction than the higher-order cells, just as the higher-order cells are a higher abstraction than the basic atom cells. Changing the parameter of a device, for instance, may cause many changes in the parameters of the basic atom cells. Without the invention, there would be no lower cells at all; all the programming would be done at the highest level. By comparison, under the invention, the designer only needs to change the parameter of a device, and if the device and its higher-order cells are defined correctly, appropriate changes are propagated through to and made within the basic atom cells.

The hierarchical structure shown in FIG. 1(*a*) and extended in FIG. 1(*b*) may be additionally extended as shown in FIG. 1(*c*), which is a diagram of a semiconductor test structure, defined by relating three instances of the devices that have been defined in FIG. 1(*b*). Semiconductor test structure 146 is defined by relating two instances of devices of type "1," devices 148 and 152, as devices of type "1" have been defined as device 132 of FIG. 1(*b*), and one instance of devices of type "2," device 150, as devices of type "2" have been defined as device 140 of FIG. 1(*b*). The semiconductor test structure of FIG. 1(*c*) is for representative purposes only, and does not specifically relate to any given type of semiconductor structure.

Each of structure 146 and devices 148, 150 and 152 has a set of parameters related to its type. Desirably, structure 146 has parameters that when changed also change the parameters of devices 148, 150 and 152, which in turn change the parameters of the higher-order cells making up these devices (not shown in FIG. 1(*c*)), which in turn change the parameters of the atoms making up these cells (also not shown in FIG. 1(*c*)). That is, changing a parameter for structure 146 may change a parameter for device 150, which as a type "2" device has two constituent higher-order cells, as has been shown in and described in conjunction with FIG. 1(*b*). Further, this change in a parameter for device 150 may cause a change in one of the parameters of one of the two constituent higher-order cells, which may then cause a change in one of the parameters of one of the basic atom cells of this higher-order cell.

Thus, the semiconductor test structure of FIG. 1(*c*) (as based on the structures of FIGS. 1(*a*) and 1(*b*)) may be viewed as being represented by a hierarchical data structure having four layers of abstraction: a highest layer of abstraction, the test structure itself; a second highest layer of abstraction, the devices making up the test structure; a third highest layer of abstraction, the higher-order cells making up the devices; and a lowest level of abstraction, the basic atom cells making up the higher-order cells. Changing the parameters of any one layer of abstraction causes the changing of the parameters of an immediately lower layer of abstraction, which then propagates changes down to the lowest level of abstraction. The FIGS. 1(*a*), 1(*b*) and 1(*c*) may also be viewed as a computerized system, such that changing one aspect (parameter) of the system during the design of a test structure causes lower aspects of the system to automatically change. Note that other layers of abstraction can be formed on top of the four shown in and described in conjunction with FIGS. 1(*a*), 1(*b*), and 1(*c*), such as circuits and integrated circuit chips.

The hierarchical design of semiconductor test structures as has been shown in and described in conjunction with FIGS. 1(*a*), 1(*b*) and 1(*c*) provides for advantages not found in the prior art. By abstracting each layer within a semiconductor test structure, for example, different users can be responsible for different parts of the design, without having to be skilled in all aspects of the structure's design. For instance, one designer may be responsible for designing a library of basic atom cells, or a single very flexible basic atom cells. Another designer may be responsible for designing a library of higher-order cells based on the basic atom cell or cells. Still another designer may be responsible for designing devices based on the higher-order cells. A designer who is responsible for designing the structure itself can piece together a structure based on the devices and higher-order cells that have already been created. Finally, an end user may use this structure to create different instances thereof by simply changing the parameters of the structure in accordance with current specifications. This is advantageous, because this user does not have to be skilled in manipulation of the basic atom cells, since changing the parameters thereof will be accomplished automatically by changing parameters of the structure itself. Another advantage of the invention is that the cell designer can build in optimal design characteristics into the cell structure, and be guaranteed that those characteristics are retained in a specific instance of the cell placement by a cell user who may not be fully aware of the optimal design characteristics. In this way, the cells can incorporate and pass on a high level of design experience and avoid the possibility of design errors caused by inexperienced designers.

A hierarchical semiconductor test structure design according to an exemplary embodiment of the invention has been shown and described. Those of ordinary skill within the art will appreciate that the invention is not limited to the specific embodiment shown in and described in conjunction with FIGS. 1(a)–1(c), however. For instance, there may be many more higher-order cells than the three defined in FIG. 1(a), each of which may have many more constituent basic atom cells than the number shown in FIG. 1(a). For further instance, there may be many more devices than the two defined in FIG. 1(b), each of which also may have many more constituent higher-order cells than the number shown in FIG. 1(b). Finally, the structure shown in FIG. 1(c) may have many more constituent devices than the number shown in FIG. 1(c).

Referring next to FIG. 2, a flowchart of a method according to an exemplary embodiment of the invention is shown. The method may be implemented as a computerized method executed as a computer program on a suitably equipped computer (in particular, executed by a processor of the computer from a computer-readable medium of the computer, such as a memory). Such a computer program may be stored on a computer-readable medium, such as a floppy disk, a compact-disc read-only-memory (CD-ROM), or a memory such as a random-access memory (RAM) or a read-only memory (ROM). The invention is not so limited. The method may be also be utilized to create a semiconductor test structure in accordance with an embodiment of the invention.

In step 200, a basic atom cell is created. This basic cell may be such as those described in conjunction with FIG. 1(a). The basic atom cell has at least one parameter that affects attributes thereof. The basic atom cell is the lowest abstraction within the hierarchical data structure for the semiconductor test structure.

In step 202, higher-order cells, such as those of FIG. 1(a), are created. Each higher-order cell relates a plurality of instances of the basic atom cell. Desirably, higher-order cells also have parameters that affect attributes thereof. These parameters are such that when one of the parameters changes, one or more of the parameters of one or more of the plurality of instances of the basic atom cell related by the higher-order cell also change. In this way, the higher-order cells are a higher abstraction than the basic atom cell, and enable a designer to work with higher-order cells without having to specifically work with basic atom cells.

In step 204, devices, such as those of FIG. 1(b), are created. Each device relates a plurality of instances of higher-order cells. Desirably, devices also have parameters that affect attributes thereof. These parameters are also such that when one of the parameters changes, one or more of the parameters of the one or more of the plurality of instances of the higher-order cells also change (and thus instigating change to basic atom cells as well). The devices are a higher abstraction than the higher-order cells, permitting a designer to work with devices without having to specifically work with higher-order cells or basic atom cells.

Finally, in step 206, a test structure, such as that of FIG. 1(c), is created. A test structure relates a plurality of instances of devices. Desirably, test structures also have parameters that affect attributes thereof. These parameters are such that when one of them changes, one or more of the parameters of the one or more of the plurality of instances of the devices also change (and thus instigating change to higher-order cells and basic atom cells as well). The structures are the highest abstraction, and permit a designer to work with a test structure without having to specifically work with devices, higher-order cells, or basic atom cells.

The method of FIG. 2 thus provides for the design of a semiconductor test structure in a hierarchical manner. Each of the basic cells of step 200 may be used in a number of different higher-order cells, which may be used in a number of different devices, which may be used in a number of different test structures. The hierarchical approach permits specialization as well: a designer may specifically only be skilled at creating one of the levels of abstraction, saving his or her work in a library such that the designer constructing the next layer of abstraction is able to utilize the immediately lower layer without having particular skill in construction of such lower layers.

Referring next to FIG. 3, a diagram of a computer in conjunction with which an exemplary embodiment of the invention may be implemented is shown. Those of ordinary skill within the art will recognize that the invention is not limited to the computer shown in FIG. 3, however. In one embodiment, the computer is running Design Framework II (DF2) software, available from Cadence Design Systems, Inc., and in conjunction with which an embodiment of the invention may be implemented.

Computer 310 of FIG. 3 is operatively coupled to monitor 312, pointing device 314, and keyboard 316. Computer 310 includes a processor (such as an Intel Pentium processor or a reduced instruction set (RISC) processor), random-access memory (RAM), read-only memory (ROM), and one or more storage devices, such as a hard disk drive, a floppy disk drive (into which a floppy disk can be inserted), an optical disk drive, and a tape cartridge drive. The memory, hard drives, floppy disks, etc., are types of computer-readable media. The invention is not particularly limited to any type of computer 310. Computer 310 desirably is a computer running a version of the UNIX operating system. The construction and operation of such computers are well known within the art.

Furthermore, computer 310 may be communicatively connected to a local-area network (LAN), a wide-area network (WAN), an Intranet, or the Internet, any particular manner by which the invention is not limited to, and which is not shown in FIG. 3. Such connectivity is well known within the art. In one embodiment, the computer includes a modem and corresponding communication drivers to connect to the Internet via what is known in the art as a "dial-up connection." In another embodiment, the computer includes an Ethernet or similar hardware card to connect to a local-area network (LAN) or wide-area network (WAN) that itself is connected to an Intranet or the Internet via what is know in the art as a "direct connection" (e.g., T1 line, etc.).

Monitor 312 permits the display of information, including computer, video and other information, for viewing by a user of the computer. The invention is not limited to any particular monitor 312, and monitor 312 is one type of display device that may be used by the invention. Such monitors include cathode ray tube (CRT) displays, as well as flat panel displays such as liquid crystal displays (LCD's). Pointing device 314 permits the control of the screen pointer provided by the graphical user interface of operating systems. The invention is not limited to any particular pointing device 314. Such pointing devices include mouses, touch pads, trackballs, remote controls and point sticks. Finally, keyboard 316 permits entry of textual information into computer 310, as known within the art, and the invention is not limited to any particular type of keyboard.

Referring finally to FIG. 4, a diagram of a semiconductor memory in conjunction with which a semiconductor test structure hierarchically designed in accordance with an embodiment of the invention may be tested is shown. That is, FIG. 4 shows a semiconductor memory for which semiconductor test structures designed in accordance with the hierarchical manner of an embodiment of the invention may be utilized—the reason why semiconductor test structures are necessary is to ensure that semiconductor circuits such as the memory of FIG. 4 correctly perform according to specification. However, as described in the beginning of this detailed description, the invention itself is not limited to the design of a semiconductor test structure; the invention may be used in conjunction with the design of any semiconductor structure. The design of a semiconductor test structure is merely an exemplary use, and is used specifically in the detailed description only as such.

FIG. 4 is specifically a schematic/block diagram illustrating generally an architecture of one embodiment of a memory 400 in conjunction with which the present invention may be utilized. In the embodiment of FIG. 4, memory 400 is a dynamic random access memory (DRAM). However, the invention can be applied to other semiconductor memory devices, such as static random access memories (SRAMs), synchronous random access memories or other types of memories that include a matrix of selectively addressable memory cells. Furthermore, as has been described in the beginning of the detailed description, the invention can be applied to any type of semiconductor device, and is not limited to memory only.

Memory 400 includes a memory cell array 405, having memory cells therein that include floating gate transistors. X gate decoder 415 provides a plurality of gate control lines for addressing floating gate transistors in array 405. Y source/drain decoder 420 provides a plurality of source/drain interconnection lines for accessing source/drain regions of the floating gate transistors in array 405. Input/output circuitry 425 includes necessary sense amplifiers and input/output (I/O) circuitry for reading, writing, and erasing data to and from array 105. In response to address signals that are provided on address lines 435 during read, write, and erase operations, the operation of decoders 415 and 420 are controlled. The address signals are provided by a controller such as a microprocessor that is fabricated separately or together with memory 400, or otherwise provided by any other suitable circuits.

The description of an exemplary embodiment of the invention has been provided. Specifically, in conjunction with FIGS. 1(a)–1(c), a description of a hierarchical manner by which semiconductor test structures may be designed has been presented. In conjunction with FIG. 2, a description of a method according to which such structures may be designed in accordance with the invention has been provided. In conjunction with FIG. 3, a description of a computer in which embodiments of the invention has been presented. Finally, in conjunction with FIG. 4, a description of a semiconductor memory that may be the motivation for the hierarchical design of semiconductor test structures of the invention has also been provided.

SPECIFIC EMBODIMENT OF THE INVENTION

A description of an exemplary embodiment of the invention has been described in the previous section of the detailed description. In this section of the detailed description, a description of a specific embodiment of the invention is presented. Specifically, the description relates to an embodiment of the invention implemented using Design Framework II (DF2) software available from Cadence Design Systems, Inc. The description is provided in sufficient detail to enable one of ordinary skill in the art to make and use an embodiment of the invention utilizing DF2.

Figure 5:
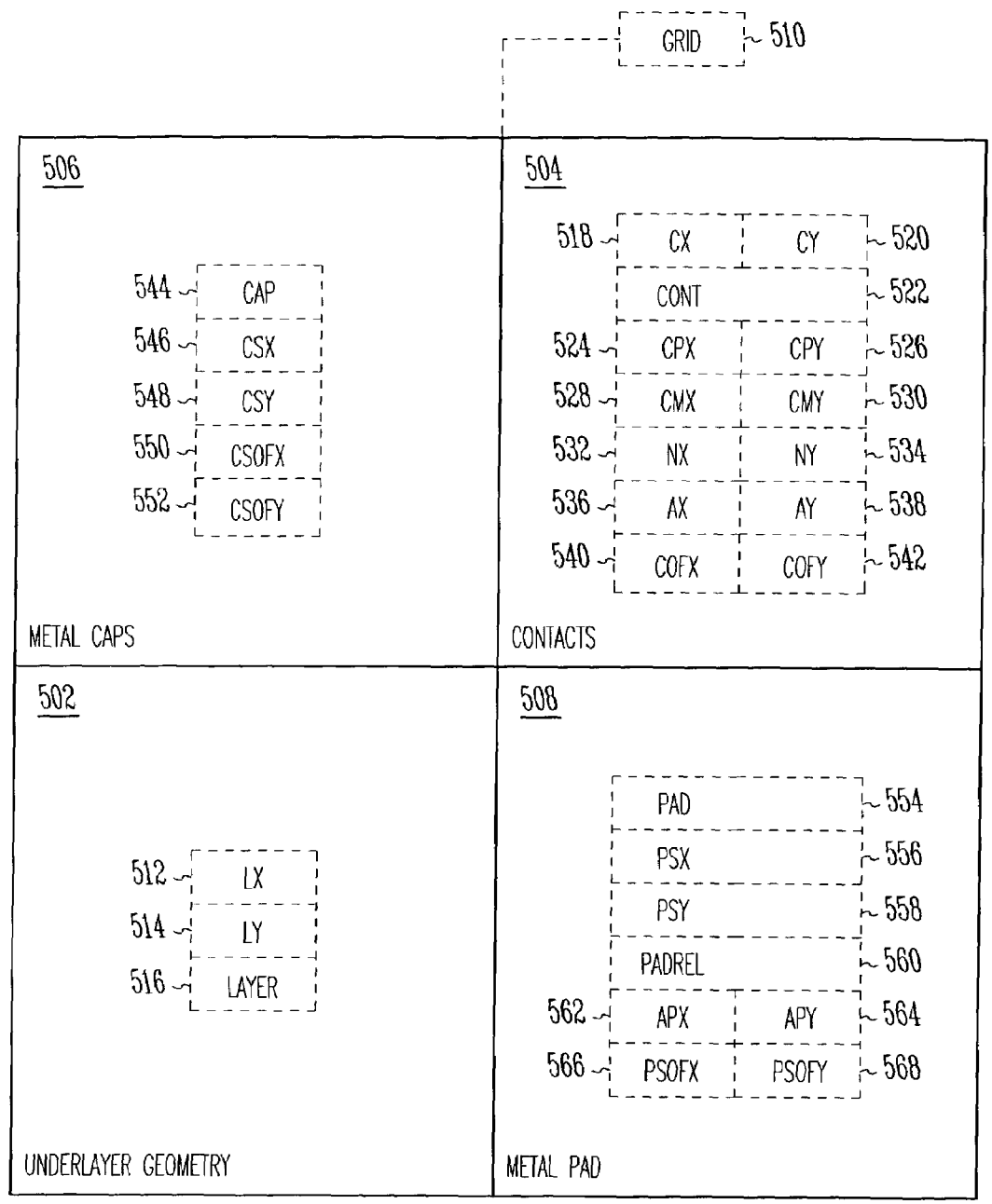
FIG. 5 shows a diagram of the parameters contained within a basic atom cell, according to one embodiment of the invention amenable to implementation in conjunction with Design Framework II (DF2) software available from Cadence Systems, Inc.

Referring first to FIG. 5, a diagram of the parameters contained with a basic atom cell, according to one embodiment of the invention amenable to implementation in conjunction with DF2, is shown. Basic atom cell 500 is termed a C1 cell, based upon pcell functionality available within DF2. Pcell functionality provides for the taking of an existing geometry and parameterizing it so that when instances of that geometry are placed, parameters can be specified that will customize that instance to meet specific design rule requirements.

Cell 500 includes underlayer geometry 502, contacts 504 that can be arrayed into a contact block and aligned over geometry 502, metal caps 506 that can be placed over each individual contact 504, and metal pad 508 that can globally cover all contacts 504. Full programming control is provided for every possible relationship of the four layers (i.e., geometry 502, contacts 504, caps 506 and pad 508) with respect to one another. Cell 510 includes grid parameter 510 to ensure that all geometries and shifts within cell 500 are accomplished in units of a grid. This ensures that cell 500 is always consistent with an underlying grid structure.

Geometry 502 has three associated parameters, lx 512, ly 514, and layer 516. Lx 512 and ly 514 are x and y values, respectively, that control the size of geometry 502. Layer 516 specifies the type of the base layer provided by geometry 502 (such as nplsaa, npoly, etc., as known within the art). An "N" type for layer 516 turns off this base layer within cell 500.

Contacts 504 have thirteen associated parameters, cx 518, cy 520, cont 522, cpx 524, cpy 526, cmx 528, cmy 530, nx 532, ny 534, ax 536, ay 538, cofx 540 and cofy 542. Cx 518 and cy 520 are x and y values, respectively, that control the size of the layer of contact 504. Cont 522 specifies the type of the base layer for contacts 504. An "N" type for cont 522 turns off this layer within cell 500. Cpx 524 and cpy 526 are x and y values, respectively, that specify the pitch of the contacts within the base layer. Cmx 528 and cmy 530 are x and y values, respectively, that specify the minimum allowed distance of the contact block to the base layer edge provided within contacts 504.

Nx 532 and ny 534 are x and y values, respectively, that specify the number of contacts within the allowed area of the base layer provided by cont 522. The allowed area is the region of the base layer that is defined by (lx minus two times cmx) and (ly minus two times cmy) in dimension. A value of nx and ny of 0.0 fills up zero percent of the allowed area in the base layer with contacts (i.e., no contacts). A value of 1.0 for nx and ny fills 100% of the allowed area in the base layer with contacts. A negative number for nx and ny forces the absolute value of that number of contacts to be placed. For example, an nx value of negative three and an ny value of negative five creates a contact block of three by five contacts independent of the allowed region of the base layer.

Ax 536 and ay 538 are x and y values, respectively, that align the contact block within the allowed region of the base layer. An ax value of negative one pushes the contact block to the extreme left of the allowed region. An ax value of one pushes the contact block to the extreme right of the allowed region. An ax value of zero centers the contact block within the allowed based region. Similar behavior applies to ay 538. Fractional values between negative one and positive one accords proportional behavior.

While ax 536 and ay 538 produce shifts in the contact block relative to the base layer, cofx 540 and cofy 542 are x and y values, respectively, that produce absolute shifts in addition to those produced by ax 536 and 538. For example, if contacts are to be 0.1 micron off center in the x direction and centered exactly in the y direction, the parameters are to be set as follows: ax as zero, cofx as 0.1, ay as zero, and cofy as 0.

Thus, nx and ny calculate the size of the contact array, and ax and ay align that array over the base layer. If nx and ny are negative, then the absolute value of that number is the number of contacts; for example, if nx is minus eight and ny is minus five, then an eight by five array of contacts is aligned over the allowable base layer. If nx and ny are positive, then it can take values from zero through one. If nx is one, for example, then 100% of the allowable area is filled with contacts in the x direction. If nx is 0.5, then 50% of the allowable area is filled within contacts in the x direction. (The allowable area is lx minus two times cmx and ly minus two times cmy.)

Once nx and ny have been used to determine the size of the contact array, ax 536 and ay 538 are used to align that array over the allowable area. If ax is one, then the contacts are pushed to the extreme right of the allowable area. If ax is zero, then the contacts are centered in the allowable area. If ax is minus one, then the contacts are pushed to the extreme left of the allowable area. Ay 538 behaves similarly in the y direction.

Ax and ay shift contacts based upon a percentage of the available space. The contact offset parameters, cofx 540 and cofy 542, allow the contacts to be shifted by a fixed amount from the default positions given by ax 536 and ay 538. For example, if contacts are to be shifted 0.1 micron to the right of center, ax is set to zero and cofx is set to 0.1.

Metal caps 506 has five associated parameters, cap 544, csx 546, csy 548, csofx 550, and csofy 552. Cap 544 specifies the type of the cap layer provided by metal caps 506. A value of "N" turns off the cap layer. Csx 546 and csy 548 are x and y values, respectively, that specify the surround of caps 506 with respect to contacts 504. Values of zero for csofx and csofy center the caps about the contacts. Any other values cause offsets of the cap layer by the specified amount.

Finally, metal pad 508 has eight associated parameters, pad 554, psx 556, psy 558, padrel 560, apx 562, apy 564, psofx 566 and psofy 568. Pad 554 specifies the layer type of the pad layer provided by pad 508. A value of "N" turns off the pad layer. Psx 556 and psy 558 are x and y values, respectively, that control the size of the pad layer that globally surrounds the contact block. The effect of psy and psx depends on the setting of padrel 560.

Padrel 560 is a boolean parameter determining the effect of psx 556 and psy 558. If padrel is set to "Y," then the pad layer covers the contact block by values of (csx plus psy) and (csy plus psy) in the x and y directions, respectively (that is, the pad is placed relative to the contact block). If padrel is set to "N," then the size of the pad is provided by psx and psy independent of the size of the contact block and other parameters.

Apx 562 and apy 564 are x and y values, respectively, that align the pad with respect to the contact block, and behaves in a similar fashion to ax 536 and ay 536 that have already been described. Psofx 566 and psofy 568 are x and y values, respectively, that offset the pads by the given amount from the alignment that results from the values of psx, psy, apx, apy, and padrel.

As has been described, C1 cell 500 is a parameterized cell that has four layers: underlayer geometry (or base layer) 502, contacts layer 504, metal caps layer 506, and metal pad layer 508. The variables (parameters) within the C1 cell allow any size rectangular base layer to be created. Contacts of any size can be put into this base layer. Caps can be placed over these contacts with any cap overlap contact dimension in the x and y direction. The number of contacts that are placed within the base layer can be specified directly (e.g., nx as minus eight, ny as minus thirteen), or can be input as a percentage of the allowable area that can hold contacts.

This allowable area is determined by subtracting two times cmx and two times cmy from the x and y dimensions of the base layer, respectively. For example, if lx and ly are 100 and 100 (specifying size of the base layer), and cmx and cmy are 20 and 30, then the allowable area for contacts is 60 in the x direction and 40 in the y direction. Contacts fill up this area based upon the contact size and contact pitch that is specified. Once the number of allowable contacts are placed, then the contacts can be shifted as a group anywhere within the allowable area. The caps over the contacts, and the metal pads, are completely programmable in terms of size as well as offsets in the x and the y directions.

The layer parameters, layer 516, cont 522, cap 544, and pad 554, are used to determine the layers that are used in cell 500. For example, the base layer specified by layer 516 can be changed to an allowable layer. If an "N" is input in either layer, cont, cap or pad, then those layers will not be placed. That is, if cap or cont is "N" then no contact or cap layer will be present regardless of the values any variables related to those layers may have.

The basic atom cell described and shown as cell 500 of FIG. 5 is termed a C1 cell. It is the most general cell, allowing full control in the x and y directions of cont, cap and pad. The contacts align to the base layer, the caps align to the contacts, and the pad aligns to the contacts. Other basic atom cells derived from the C1 cell are also desirable, to allow for easier creation of higher order-cells, and subsequently devices and structures. FIG. 6 shows a table of such other basic atom cells (table 600) according to one embodiment of the invention. Each of these other basic atom cells are derived from the C1 cell, or from another cell within the table. Those of ordinary skill within the art can appreciate that the invention can be used to design other different types of basic cells with specialized properties and features that can be used to create higher-order complex objects with a minimum of programming effort.

Figure 7:
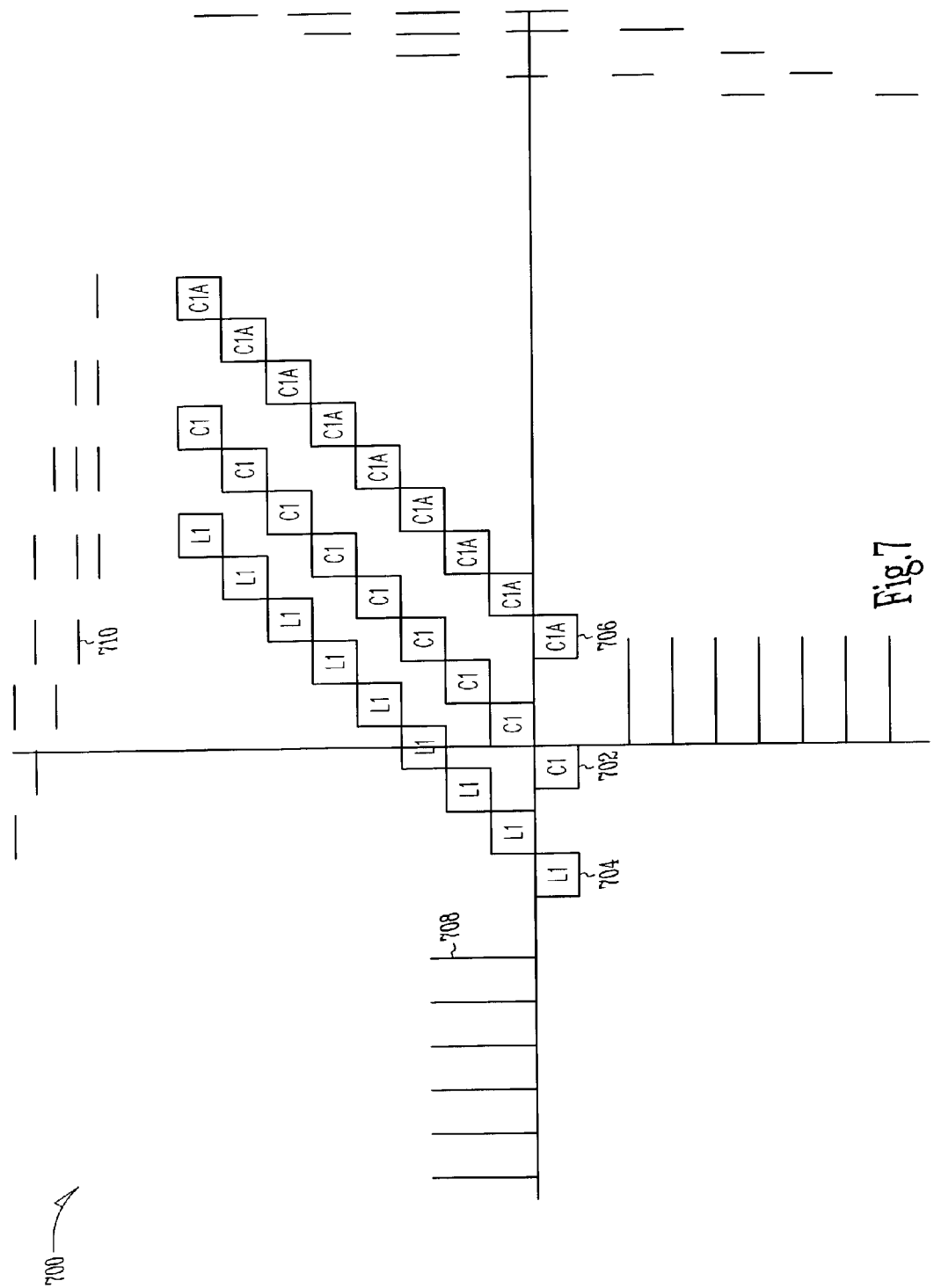
FIG. 7 shows a diagram of a master cell for use in accordance with one embodiment of the invention.

Referring next to FIG. 7, a diagram of a master cell for use in accordance with one embodiment of the invention is shown. Master cell 700 is completely programmable to produce any desired subcell by easily eliminating undesired basic atom cells from master cell 700. Thus, as shown in FIG. 7, master cell 700 includes nine C1 cells, such as C1 cell 702, nine l1 cells, such as l1 cell 704, and nine c1 a cells, such as c1 a cell 706. Associated with the cells, as known to those of ordinary skill in the art of DF2 software, are a number of horizontal and vertical stretch lines, such as stretch lines 708 and 710, which adjust the positioning of cells such as 702, 704 and 706. Using a master cell provides for quicker generation of higher-order cells, devices and structures because it is generally much quicker to delete elements from the master cell than it is to create them from a blank slate.

The parameters of the basic atom cells provide great flexibility in producing a base layer with contacts, caps, and pad. Any orthogonal parametric structure should be able to be decomposed into an array of C1 cells, for instance, with different relative orientations to one another. For example, a two-terminal resistor can be thought of as a C1 cell on the left with layer, contacts, and pad turned on and caps off; a C1 cell in the middle with contacts, cap, and pad turned off; and a C1 cell on the right with layer, contacts, pad turned on and caps turned off.

This two-terminal resistor can be viewed as including three C1 cells with cell 2 oriented to cell 1 and cell 3 oriented to cell 2. This is referred to as a c3_2 structure. It may be an end test structure in and of itself, or it may be a higher-order cell structure for use in other more complex devices and structures. Another type of test structure may be built from three C1 cells where both cell 2 and cell 3 align to cell 1. This is referred to as a c3_1 structure.

Figure 8:
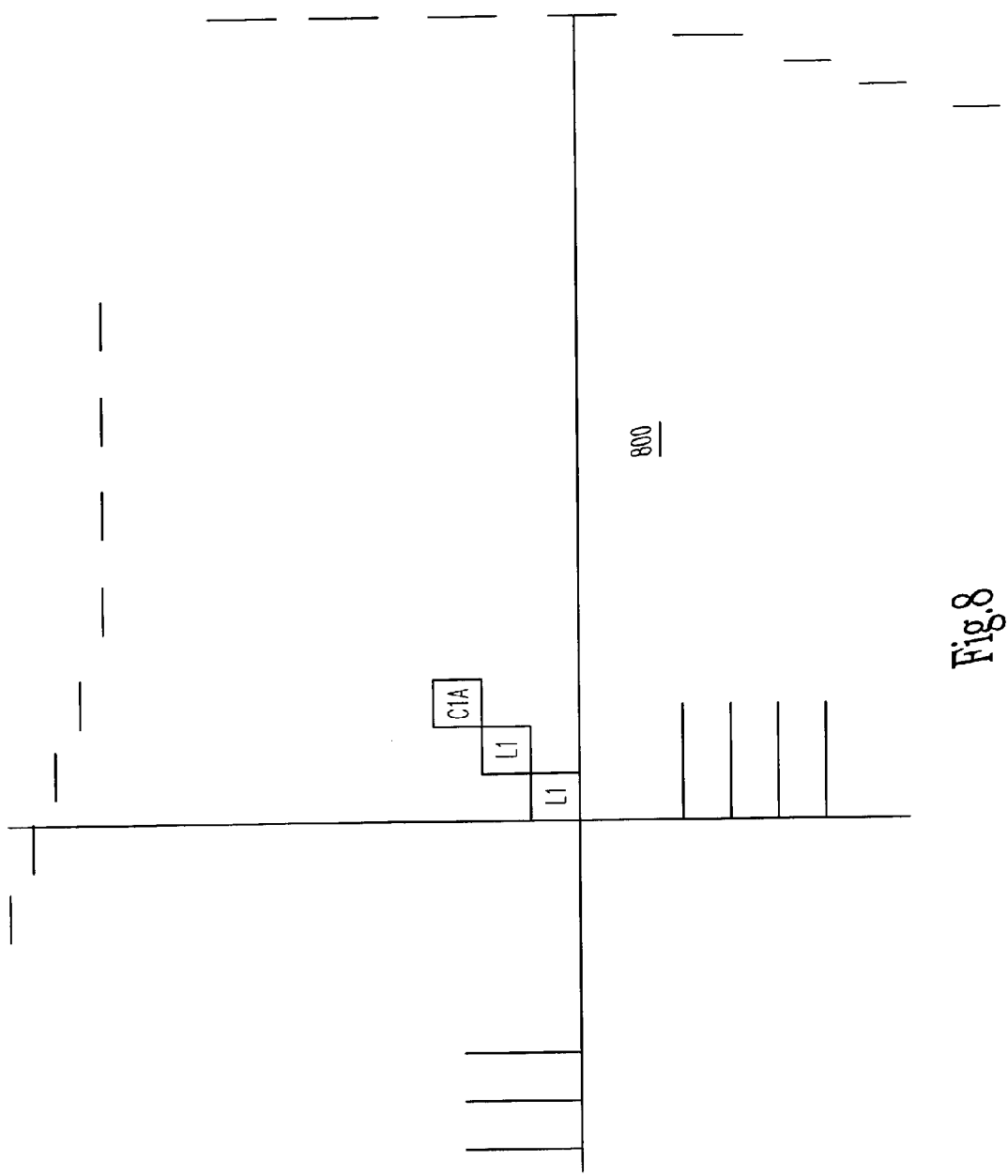
FIG. 8 shows a c9_2225678 higher-order cell, according to one embodiment of the invention.
Figure 9:
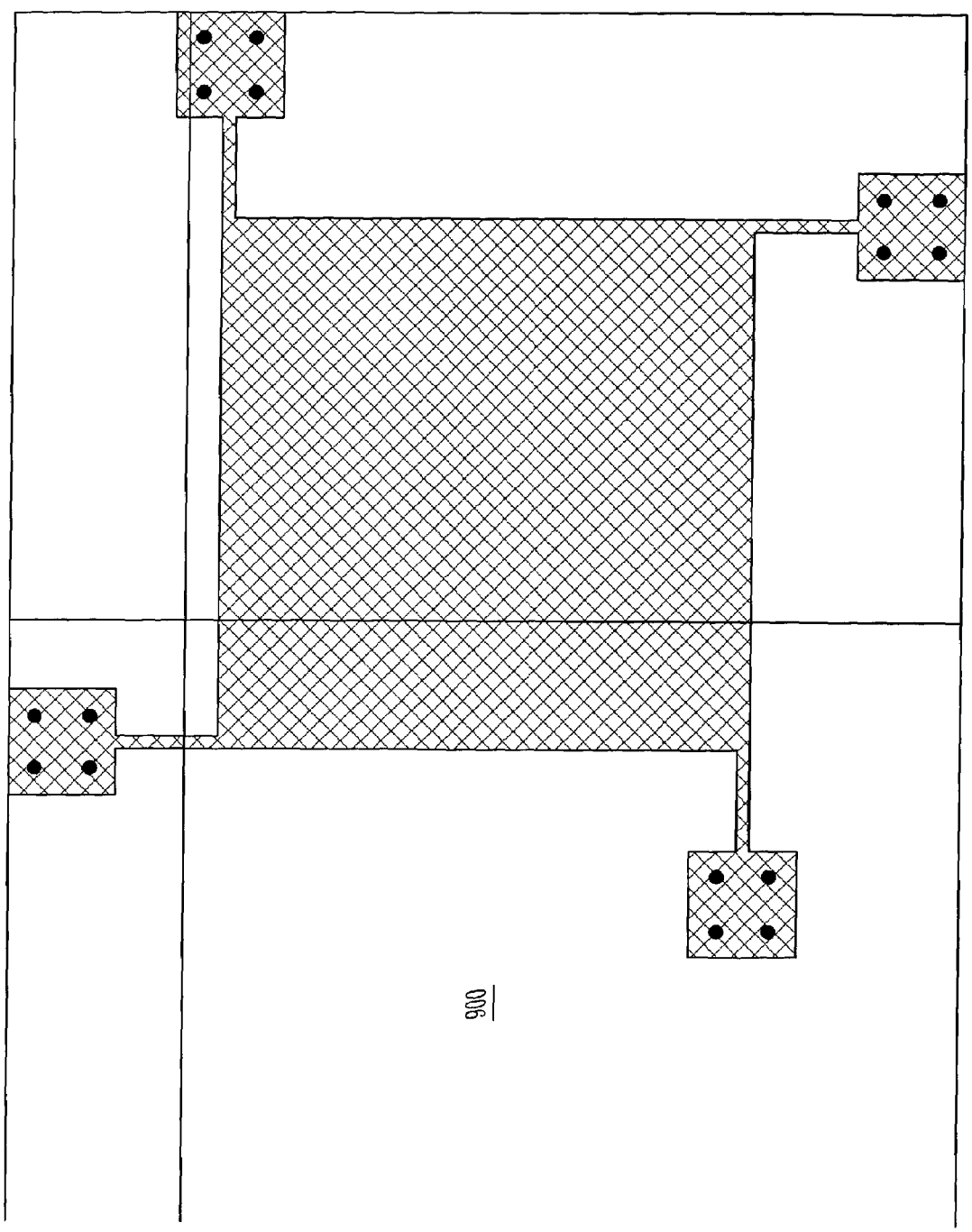
FIG. 9 shows the c9_2225678 cell of FIG. 8 after it has been converted into a VanDerPauw resistor, according to an embodiment of the invention.

A VanDerPauw resistor, known within the art, can be built from a c9_2225678: cell 1 forms the body of the resistor, cells 2, 3, 4 and 5 form the arms that align to cell 1, and cells 6, 7, 8, and 9 form the pads on the arms that align to cells 2, 3, 4 and 5, respectively. FIG. 8 shows such a c9_2225678 higher-order cell, cell 800, while FIG. 9 shows such a c9_2225678 cell after it has been converted into a VanDer-Pauw resistor, resistor 900. Higher-order cells such as c9_2225678 may be referred to as elements, and can themselves by manipulated into a vast array of parametric devices and structures.

A set of parameters referred to as shift parameters are used in higher-order cells, devices and structures to determine the relative orientation of the lower-level abstractions, such as C1 cells, with respect to one another. For example, one set of shift parameters may be shift 32x, a32x, o32x (with a similar set existing for y directions). With these parameters, the alignment of cell 3 with respect to cell 2 can be controlled. For example, setting shift 32x to 2, a32x to 0, and o32x to 0 centers cell 3 with respect to cell 2. Setting o32x to 0.1 offsets cell 3 by 0.1 micron from the center of cell 2. The a parameters take on values from minus one to plus one, and behave similar to the ax and ay parameters that shift the contacts within the C1 cell itself; i.e., it produces a relative shift about an axis. The shift 32x parameter determines the axis about which shifting occurs. For example, shift 32x set to one shifts cell 3 about the left edge of cell 2; shift 32x set to two shifts cell 3 about the center of cell 2, etc. The o32x parameter provides offsets from the shift and a parameters.

Thus, a collection of higher-order cells (or elements) may be created to assist in development of even higher levels of abstractions, such as structures and devices. The invention is not particularly limited to any set of higher-order cells. However, a table of higher-order cells according to one embodiment of the invention is shown in FIG. 10. Within FIG. 10, table 1000 includes two columns: column 1002, which lists the higher-order cells, and column 1004, which lists the basic atom cells that constitute these higher-order cells, and/or a description of the higher-order cells.

The creation of such higher-order cells is accomplished by relating together two or more basic atom cells, and attaching appropriate parameters thereto. For example, the c2 cell includes two C1 cells. Each C1 cell has its own set of parameters such as l1x, l2x, l1y, l2y, etc. In addition, there are a set of parameters that determine how the second C1 cell is aligned to the first. That is, the combination of the set of parameters determines how the second C1 cell is aligned to the first C1 cell in the x and y directions.

Specifically, there are six parameters: shift 21x, shift 21y, a21x, a21y, o21x, and o21y. Shift 21x determines the type of shift that layer 2 does with respect to layer 1 in the x direction. Shift 21y determines the type of shift that layer 2 does with respect to layer 1 in the y direction. A21x determines the percentage amount of shift in the x direction, while a21y determines the percentage amount of shift in the y direction. O21x determines the absolute shift in the x direction after a21x has been applied, while o21y determines the absolute shift in the y direction after a21y has been applied. The a21x and a21y parameters have possible values ranging from minus one to plus one.

For further example, a c3 cell has three C1 cells that align to one another. Cell 2 aligns only to cell 1 but cell 3 aligns to either cell 1 or to cell 2. Thus, there are two types of c3 cells: c3_1 and c3_2 C3_1 has cell 3 aligning to cell 1 has cell 3 aligning to cell 2. The c1 and c2 cells require no extensions. The c3 cell has local parameters such as l1x, l2x and l3x, and also global parameters to determine the relative shifts of the c1, c3 and c3 cells. Thus, in c3_2 there are parameters shift 32x, shift 32y, a32x, a32y, o32x. o32y, shift 21x, shift 21y, a21x, a21y, o21x and o21y. In c3_1 there are the parameters shift 31x, shift 31y, a31x, a31y, o31x, o31y, shift 21x, shift 21y, a21x, a21y, o21x and o21y. As a final example, a c4 cell has four C1 cells that align to one another. There are four variations, namely c4_11, c4_12, c4_22 and c4_23.

Once a core library of higher-order cell has been created, as has been shown in FIG. 10, a library of devices and structures can then also be created. All devices and structures eventually lead back to basic atom cells. A table of exemplary devices and structures, and their descriptions, according to one embodiment of the invention is shown as table 1100 in FIG. 11. Devices are desirably built up from higher-order cells, and structures are desirably built up from devices. Further layers of abstraction are also possible, such as modules, built up from structures, and integrated circuit chips, built up from modules.

Thus, once structures have been created, higher levels of abstraction, such as the module, can also be created. A module has programmable pads, with structures in-between the pads. The size of the structures and their orientation are connected to the location, size and orientation of the interconnection pads. Higher level parameters may be used to configure the entire module, controlling all aspects of the module from pad size and pitch to inner-structure details such as transistor nibble, gate length, etc.

A description of a specific embodiment of the invention, for implementation in conjunction with DF2 software, has been described. Those of ordinary skill within the art will appreciate that while the invention has been described in relation to DF2 software, the invention is not so limited. Thus, an embodiment of the invention utilizing other software, or programmed from scratch, is within the scope of the invention.

CONCLUSION

Hierarchical semiconductor structure design has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

I claim:

1. Apparatus comprising:
   a basic atom cell utilizable in design of a semiconductor test structure, the atom cell including:
      an underlayer geometry;
      a plurality of contacts arrayed into a contact block and aligned of the underlayer geometry;
      a plurality of metal caps, each cap placed over a corresponding contact; and,
      a metal pad globally covering one or more of the plurality of contacts.

2. The apparatus of claim 1, the atom cell further comprising a plurality of programmable parameters, the plurality of programmable parameters providing for control over relationship among the underlayer geometry, the plurality of contacts, the plurality of metal caps, and the metal pad.

3. The apparatus of claim 2, wherein the plurality of parameters includes a grid parameter to insure that geometries and shifts within the cell are executed in units of a grid.

4. The apparatus of claim 2, wherein the plurality of parameters includes:
   an lx parameter and an ly parameter to specify a size of the underlayer geometry; and,
   a layer parameter to specify a type of the underlayer geometry, wherein an "N" type indicates that no underlayer exists for the cell.

5. The apparatus of claim 2, wherein the plurality of parameters includes:
   a cx parameter and a cy parameter to specify a size of the contacts;
   a cont parameter to specify a type of the contacts, wherein an "N" type indicates that no contacts exist for the cell;
   a cpx parameter and a cpy parameter to specify a pitch of the contacts within the underlayer geometry;
   a cmx parameter and a cmy parameter to specify a minimum allowable distance of the contact block to an edge of the underlayer geometry;
   an nx parameter and an ny parameter to specify a maximum allowable number of contacts within an allowable area of the underlayer geometry;
   an ax parameter and an ay parameter to specify alignment of the contact block within the allowable area of the underlayer geometry; and,
   a cofx parameter and a cofy parameter to produce shifts in the contact block relative to the underlayer geometry.

6. The apparatus of claim 2, wherein the plurality of parameters includes:
   a cap parameter to specify a type of the metal caps, wherein an "N" type indicates that no metal caps exist for the cell;
   a csx parameter and a csy parameter to specify a surround of the metal caps relative to the contacts; and,
   a csofx parameter and a csofy parameter to specify an offset of the metal caps relative to the contacts.

7. The apparatus of claim 2, wherein the plurality of parameters includes:
   a pad parameter to specify a type of the metal pad, wherein an "N" type indicates that no metal pad exists for the cell;
   a psx parameter and a psy parameter to specify a size of the metal pad;
   a padrel parameter to indicate application of the psx and psy parameters relative to the contact block;
   an apx parameter and an apy parameter to specify alignment of the metal pad relative to the contact block; and,
   a psofx parameter and a psofy parameter to specify an offset of the metal pad relative to the alignment specified by the apx parameter and the apy parameter.

8. A basic atom cell utilizable in design of a semiconductor test structure comprising:
   an underlayer geometry;
   a plurality of contacts arrayed into a contact block and aligned of the underlayer geometry;
   a plurality of metal caps, each cap placed over a corresponding contact;
   a metal pad globally covering one or more of the plurality of contacts;
   a hierarchy of abstractions ordered from highest to lowest, each abstraction relating a plurality of instances of an immediately lower abstraction, the highest abstraction corresponding to the structure, and the lowest abstraction corresponding to the basic atom; and
   a plurality of sets of parameters, each set of parameters corresponding to an instance of an abstraction, such that changing one of the set of parameters for an instance changes at least one of the set of parameters for an instance of an immediately lower abstraction, the plurality of sets of programmable parameters providing for control over relationship among the underlayer geometry, the plurality of contacts, the plurality of metal caps, and the metal pad.

9. The basic atom cell of claim 8, wherein the plurality of parameters includes a grid parameter to insure tat geometries and shifts within the cell are executed in units of a grid.

10. The basic atom cell of claim 8, wherein the plurality of sets of parameters includes:
    an lx parameter and an ly parameter to specify a size of the underlayer geometry; and,
    a layer parameter to specify a type of the underlayer geometry, wherein an "N" type indicates that no underlayer exists for the cell.

11. The basic atom cell of claim 8, wherein the plurality of sets of parameters includes:
    a cx parameter and a cy parameter to specify a size of the contacts;
    a cont parameter to specify a type of the contacts, wherein an "N" type indicates that no contacts exist for the cell;
    a cpx parameter and a cpy parameter to specify a pitch of the contacts within the underlayer geometry;
    a cmx parameter and a cmy parameter to specify a minimum allowable distance of the contact block to an edge of the underlayer geometry;
    an nx parameter and an ny parameter to specify a maximum allowable number of contacts within an allowable area of the underlayer geometry;
    an ax parameter and an ay parameter to specify alignment of the contact block within the allowable area of the underlayer geometry; and,
    a cofx parameter and a cofy parameter to produce shifts in the contact block relative to the underlayer geometry.

12. The basic atom cell of claim 11, wherein the plurality of parameters includes:
- a cap parameter to specify a type of the metal caps, wherein an "N" type indicates that no metal caps exist for the cell;
- a csx parameter and a csy parameter to specify a surround of the metal caps relative to the contacts; and,
- a csofx parameter and a csofy parameter to specify an offset of the metal caps relative to the contacts.

13. The basic atom cell of claim 11, wherein the plurality of parameters includes:
- a pad parameter to specify a type of the metal pad, wherein an "N" type indicates that no metal pad exists for the cell;
- a psx parameter and a psy parameter to specify a size of the metal pad;
- a padrel parameter to indicate application of the psx and psy parameters relative to the contact block;
- an apx parameter and an apy parameter to specify alignment of the metal pad relative to the contact block; and,
- a psofx parameter and a psofy parameter to specify an offset of the metal pad relative to the alignment specified by the apx parameter and the apy parameter.

14. A basic atom cell utilizable in design of a semiconductor structure comprising:
- a plurality of contacts arrayed into a contact block aligned in accordance with an underlayer geometry;
- a plurality of metal caps, at least one of the caps placed over a corresponding contact;
- a metal pad globally covering one or more of the plurality of contacts;
- a hierarchy of abstractions ordered from highest to lowest, each abstraction relating a plurality of instances of an immediately lower abstraction, the highest abstraction corresponding to the structure, and the lowest abstraction corresponding to the basic atom; and
- a plurality of sets of parameters, each set of parameters corresponding to an instance of an abstraction, such tat changing parameters for an instance changes parameters for an instance of an immediately lower abstraction, the parameters providing for control over a relationship among the plurality of contacts, the plurality of metal caps, and the metal pad.

15. The basic atom cell of claim 14 wherein the hierarchy of abstractions ordered from lowest to the highest comprises: atoms, higher order cells, devices, structures, circuits and integrated circuit chips.

* * * * *

UNITED STATES PATENT AND TRADEMARK OFFICE
CERTIFICATE OF CORRECTION

PATENT NO. : 7,096,446 B2
APPLICATION NO. : 10/230937
DATED : August 22, 2006
INVENTOR(S) : Karniewicz It is certified that error appears in the above-identified patent and that said Letters Patent is hereby corrected as shown below:

In column 13, line 2, delete "c1 a" and insert -- c1a --, therefor.

In column 13, line 3, delete "c1 a" and insert -- c1a --, therefor.

In column 14, line 28, delete "c3_2" and insert -- c3_2. --, therefor.

In column 14, line 28, delete "cell 1" and insert -- cell 1 and c3_2 --, therefor.

In column 14, line 33, delete "o32x." and insert -- o32x, --, therefor.

In column 15, line 14, in Claim 1, after "Apparatus" insert -- , --.

In column 16, line 40, in Claim 9, delete "tat" and insert -- that --, therefor.

In Column 18, line 14, in Claim 14, delete "tat" and insert -- that--, therefor.

Signed and Sealed this

Twenty-seventh Day of March, 2007

JON W. DUDAS
*Director of the United States Patent and Trademark Office*